US011434560B2

(12) United States Patent
Banaszak et al.

(10) Patent No.: US 11,434,560 B2
(45) Date of Patent: Sep. 6, 2022

(54) INDUSTRIAL VAPOUR GENERATOR FOR THE DEPOSITION OF AN ALLOY COATING ONTO A METAL STRIP

(75) Inventors: Pierre Banaszak, Vivegnis (BE); Didier Marneffe, Engis (BE); Eric Silberberg, Haltinne-Gesves (BE); Luc Vanhee, Fromelennes (FR)

(73) Assignee: Arcelormittal France, Liege (BE)

( * ) Notice: Subject to any disclaimer, the term of this patent is extended or adjusted under 35 U.S.C. 154(b) by 1037 days.

(21) Appl. No.: 12/681,969

(22) PCT Filed: Oct. 10, 2008

(86) PCT No.: PCT/EP2008/063638
§ 371 (c)(1),
(2), (4) Date: Sep. 20, 2010

(87) PCT Pub. No.: WO2009/047333
PCT Pub. Date: Apr. 16, 2019

(65) Prior Publication Data
US 2011/0000431 A1    Jan. 6, 2011

(30) Foreign Application Priority Data
Oct. 12, 2007  (EP) .................................... 07447056

(51) Int. Cl.
*C23C 14/16*    (2006.01)
*C23C 14/24*    (2006.01)
*C23C 14/56*    (2006.01)

(52) U.S. Cl.
CPC ............ *C23C 14/16* (2013.01); *C23C 14/243* (2013.01); *C23C 14/562* (2013.01)

(58) Field of Classification Search
USPC .................................................. 118/726, 727
See application file for complete search history.

(56) References Cited

U.S. PATENT DOCUMENTS 2,387,970 A * 10/1945 Paul .............................. 427/250
2,564,231 A *  8/1951 Pitney ......................... 137/87.02
(Continued)

FOREIGN PATENT DOCUMENTS

EP    0 730 045 A2    9/1996
EP    0 756 022 A2    1/1997
(Continued)

OTHER PUBLICATIONS

English translation JP 06-136537, Matsuda, May 1994 (Year: 1994).*
(Continued)

*Primary Examiner* — Keath T Chen
(74) *Attorney, Agent, or Firm* — Reinhart Boerner Van Deuren P.C.

(57) ABSTRACT

The invention relates to a vapour generator for the deposition of a metal coating onto a substrate (7), preferably a steel strip, that comprises a vacuum chamber (6) in the form of a housing including a vapour deposition head or ejector (3) in tight communication via a supply duct (4) with at least one crucible (1) containing the coating metal in a liquid form and located outside the vacuum chamber (6), characterised in that the ejector (3) includes a longitudinal slot for the vapour outlet acting as a sonic throat and extending on the entire width of the substrate (7), a filtration medium or a charge loss member (3A) made of a sintered material being provided in the ejector immediately before said slot on the vapour path in order to equalise the flow speed of the vapour exiting the ejector (3) through the sonic throat.

21 Claims, 13 Drawing Sheets

(56) References Cited

U.S. PATENT DOCUMENTS

| | | | | |
|---|---|---|---|---|
| 2,761,286 | A | * | 9/1956 | Billue et al. .................. 62/50.2 |
| 3,409,726 | A | * | 11/1968 | Abe et al. ...................... 373/85 |
| 4,147,534 | A | * | 4/1979 | Hori ........................ B22F 9/12 |
| | | | | 75/10.29 |
| 4,331,477 | A | * | 5/1982 | Kubo et al. .................... 75/228 |
| 4,416,421 | A | * | 11/1983 | Browning ............. B05B 7/203 |
| | | | | 239/132.3 |
| 4,979,468 | A | * | 12/1990 | Kleyer ......................... 118/726 |
| 5,002,837 | A | | 3/1991 | Shimogori et al. |
| 5,211,196 | A | * | 5/1993 | Schwelm ................. 137/596.2 |
| 5,350,598 | A | * | 9/1994 | Kleyer ...................... 427/255.5 |
| 5,362,522 | A | * | 11/1994 | Barri et al. .................. 427/435 |
| 5,876,500 | A | * | 3/1999 | Kurimoto .......... B05B 15/0208 |
| | | | | 118/410 |
| 5,904,958 | A | * | 5/1999 | Dick et al. ................ 427/248.1 |
| 6,197,438 | B1 | * | 3/2001 | Faulkner .............. A47J 27/022 |
| | | | | 428/627 |
| 6,423,144 | B1 | * | 7/2002 | Watanabe .................... 118/669 |
| 6,454,862 | B1 | * | 9/2002 | Yoshida ............ G01N 15/0266 |
| | | | | 118/722 |
| 6,656,529 | B1 | * | 12/2003 | Pankake .............. B05C 1/0813 |
| | | | | 118/261 |
| 7,056,477 | B1 | * | 6/2006 | Schwalbe et al. ........... 422/129 |
| 7,413,714 | B1 | * | 8/2008 | Schwalbe et al. ........... 422/130 |
| 2001/0011524 | A1 | * | 8/2001 | Witzman et al. ............ 118/718 |
| 2002/0192375 | A1 | * | 12/2002 | Sun et al. ................ 427/255.28 |
| 2003/0196680 | A1 | * | 10/2003 | Lee et al. ...................... 134/1.1 |
| 2003/0198741 | A1 | * | 10/2003 | Uchida et al. ............ 427/248.1 |
| 2003/0209201 | A1 | * | 11/2003 | Takamatsu et al. .......... 118/726 |
| 2004/0022942 | A1 | * | 2/2004 | Schade van Westrum et al. ........ |
| | | | | 427/248.1 |
| 2004/0026234 | A1 | * | 2/2004 | Vanden Brande et al. .................. |
| | | | | 204/192.12 |
| 2004/0046130 | A1 | * | 3/2004 | Rao ....................... C04B 35/565 |
| | | | | 250/492.1 |
| 2004/0173449 | A1 | * | 9/2004 | Nadeau et al. .................... 203/2 |
| 2005/0092369 | A1 | * | 5/2005 | Bantleon et al. .......... 137/487.5 |
| 2005/0229856 | A1 | * | 10/2005 | Malik .......................... 118/726 |
| 2007/0178225 | A1 | * | 8/2007 | Takanosu .............. C23C 14/243 |
| | | | | 427/69 |
| 2007/0266944 | A1 | * | 11/2007 | Iizuka ................. C23C 16/4402 |
| | | | | 118/722 |

FOREIGN PATENT DOCUMENTS

| | | |
|---|---|---|
| EP | 1 174 526 A1 | 1/2002 |
| JP | 06-136537 * | 5/1994 |
| WO | WO 97/47782 | 12/1997 |
| WO | WO 02/06558 A1 | 1/2002 |
| WO | WO 02/14573 A1 | 2/2002 |
| WO | WO 2005/116290 A1 | 12/2005 |

OTHER PUBLICATIONS

E. Yadin et al., "Zinc and Magnesium Vapor...", 42nd Annual Technical Conference Proceedings (1999) ISSN 0737-5921,4 p. pp. 39-42.

* cited by examiner

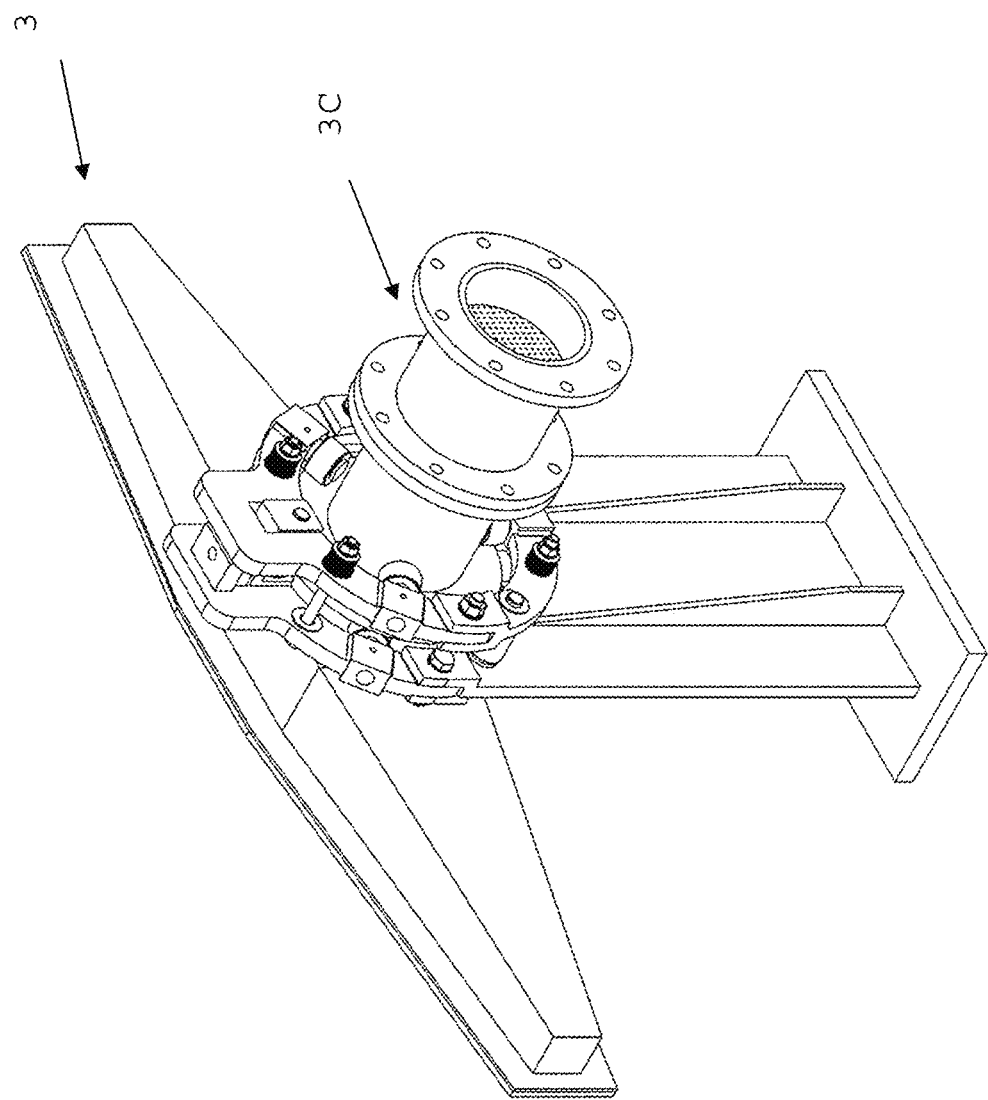

INDUSTRIAL VAPOUR GENERATOR FOR THE DEPOSITION OF AN ALLOY COATING ONTO A METAL STRIP

CROSS-REFERENCE TO RELATED APPLICATIONS

This patent application is the National Stage of International Application No. PCT/EP2008/063638, filed Oct. 10, 2008, that claims the benefit of European Application No. 07447056.8, filed Oct. 12, 2007, the entire teachings and disclosure of which are incorporated herein by reference thereto.

FIELD OF THE INVENTION

The present invention relates to an industrial vapour generator for the continuous coating in vacuum of a substrate in motion, more particularly a metal strip, by means of a metal vapour so as to form a metal layer, preferably a metal alloy layer, on its surface in such a way as to give it excellent resistance to corrosion whilst preserving good drawing and welding features.

STATE OF THE ART

It has been known since the end of the 1980's that the deposition of specific alloys such as ZnMg on the surface of a steel strip acts as protection for the steel. The excellent corrosion behaviour of ZnMg alloy is attributed to the nature of the corrosion products formed on the surface of the strip in an extremely dense layer, which acts as a barrier film.

Such an alloy deposition is not normally possible with the usual techniques such as electrolytic deposition, dip coating, etc. With dipping at atmospheric pressure, for instance, the bath of molten metal may be contaminated by the oxygen in the air, which forms oxides on the surface of the bath.

Often, the only possible solution is therefore evaporation in a vacuum of the molten metal, whether pure or in the form of an alloy (PVD, Pressure Vapour Deposition technique).

In the context of this technique, it is known that the substrate should be placed in a vacuum housing maintained at a low temperature and comprising a crucible of molten metal. Deposition then occurs on all the walls at a temperature that is lower than the temperature of the metal vapour. So, in order to improve the deposition yield on the substrate and to avoid waste, it is worthwhile heating the walls of the housing.

Document U.S. Pat. No. 5,002,837 describes the vapour deposition of a two-layer Zn/ZnMg coating with a totally alloyed $Zn_2Mg$ or $Zn_2Mg/Zn_{11}Mg_2$ phase.

Document EP-A-0 730 045 describes a coating on a steel strip with a deposition of 3 or 5 layers of ZnMg alloy deposited in a vacuum and ensuring very good resistance to corrosion with a minimum of powdering during drawing.

In document WO-A-02/06558 (or EP-A-1 174 526), a ZnMg coating is obtained in a vacuum by co-evaporation from two crucibles, one with zinc and the other with magnesium. Before they are sprayed onto the strip, the vapours are mixed in an ejector and each vapour pipe has a constricting device or a restriction in the form of plates provided with holes or slits of various shapes, which allow to obtain a vapour jet at the speed of sound and a maximum vapour flow rate in the ejector. Vapour is introduced from the crucibles into the vacuum chamber through the ejector by opening "all or nothing" valves also called mechanical shutters with two positions "On/Off" that are open when the system is started up and closed when it is shut down, respectively. The use of these valves provides a potential solution to the heating or cooling problem upon start up or shut down. If it is required to controllably heat the vapour in order to eliminate the risk of recondensation, it is proposed to use a heat exchanger such as a conductive porous filter heated by induction in the pipe which the vapour passes through.

Document WO-A-02/14573 describes the production of a coating from a galvanised base coating obtained by a conventional dip galvanisation or electro-galvanisation method, which is then itself coated in vacuum with magnesium. Rapid heating by induction allows to re-melt the deposit in a few seconds and to obtain, after cooling, a favourable ZnMg alloyed phase microstructure distribution throughout the thickness of the layer.

The Applicant also proposed a two-layer electro-galvanised/ZnMg alloy industrial product obtained by the PVD method (EP-A-0 756 022) as well as an improvement of the method with an infrared heating system to bring about the alloying of the magnesium with the zinc so as to minimise the formation of a fragile FeZn intermetallic phase.

Document WO-A-97/47782 describes a method for continuously coating a substrate in motion in which the metal vapour is generated by induction heating a crucible with a bath made of the coating metal in a vacuum housing. The vapour escapes from the crucible through a pipe that leads to an outlet aperture that is preferably calibrated, in such a way as to form a jet aimed towards the surface of the substrate to be coated. The use of an aperture in the form of a longitudinal slit with a narrow cross-section allows to regulate the vapour flow rate by weight to a constant speed of sound along the slit (sonic throat), which has the advantage of obtaining an even deposition. This technique will be referred to herein after by the acronym "JVD" (Jet Vapour Deposition).

However, this technology has several shortcomings, in particular:
 the constant supply of molten metal entails providing for its return to the tank at one or several points;
 since the molten metal comprises impurities, there is a concentration of these impurities on the surface of the bath following the evaporation, which reduces the flow rate. One solution would be to skim the surface or to recycle the
 charge but any mechanical operation is made more difficult in a vacuum;
 the difficulty of adjusting the evaporation slit to a variable strip width, which entails a means for blocking the slit on both sides, and thus the creation of a vapour-tight seal in a vacuum and at 700° C., which is not easy to achieve;
 the difficulty of blocking the slit when the motion of the strip is interrupted, which would entail the presence of a linear valve sealed over a typical length of 2 metres or more;
 the great thermal inertia of the system (at least several minutes);
 the heating, generated by induction in a vacuum, requires passing all the electrical heating power through the sealed wall to the vacuum, which does not facilitate access to and maintenance of the installation.

In addition, the state of the art does not provide a solution that satisfies the requirement of achieving the co-deposition of two different metals, which entails mixing two jets exiting from the vaporiser. The use of intermediate mixing boxes with deflectors does not provide a convincing solution.

It is possible to produce metal alloy coatings (e.g. 85% Zn, 15% Mg) by rigorously controlling the concentration of the two metals in the crucible. However, this control entails great difficulty in managing the system and in particular the homogeneity in the crucible, above all if the latter is not circular in cross-section.

In addition, it is known that the company Sidrabe Inc. (Latvia) also proposed a PVD method where the source of molten metal is displaced outside the vacuum deposition chamber, initially so as to prevent fine particles of solid magnesium from being deposited on the substrate at high evaporation speeds. The separation of the melting zone from the evaporation box by a connection pipe allows to regulate evaporation more easily. In particular, vapour pressure is measured in this pipe (e.g. in SVC 505/856-7188 42nd Annual Technical Conference Proceedings (1999), pp. 39-42).

Document WO-A-2005/116290 proposes an installation of this type where the respective levels of molten metal in the melting crucible and in the evaporation crucible are regulated by means of a magneto-hydrodynamic pump.

AIMS OF THE INVENTION

The present invention aims to provide a solution that allows to overcome the drawbacks of the state of the art.

In particular, the invention aims to achieve the following objectives:
- simplicity of implementation;
- easy access to and maintenance of the crucible(s);
- excellent evenness of the metal deposition and a simple adjustment mechanism for the deposition head to variable strip widths which can exceed 2 metres;
- maximised vapour flow rate;
- high magnetic stirring preventing impurities from separating out on the surface;
- easy regulation of the vapour flow rate by adjusting the electrical power and/or the evaporation surface temperature;
- installation facilitated by valves in cylindrical pipes of reduced diameter.

MAIN CHARACTERISTIC FEATURES OF THE INVENTION

According to Claim 1, the present invention relates to a vapour generator for depositing a metal coating on a substrate, preferably a steel strip, comprising a vacuum chamber in the form of a housing, equipped with a means for ensuring a low-pressure state relative to the external environment and equipped with a means for allowing the entry and exit of the substrate, whilst being more or less sealed relative to the external environment, said housing surrounding a vapour deposition head, called an ejector, shaped so as to create a jet of metal vapour at the speed of sound in the direction of and perpendicular to the surface of the substrate, said ejector being sealingly connected by means of a feeder pipe to at least one crucible with a coating metal in a molten state and positioned outside the vacuum chamber, wherein the ejector comprises a longitudinal outlet slit for the vapour, which acts as a sonic throat, extending across the entire width of the substrate, a filtration medium or a mechanism for loss of charge made of sintered material being positioned in the ejector immediately before said slit in the path of the vapour so as to even out the flow speed of the vapour coming out of the ejector through the sonic throat. By "evening out" the flow speed is meant evening out and guiding the speed vectors of said vapour.

According to preferred embodiments of the invention as mentioned in the dependent claims, the vapour generator as in the invention also comprises one or several of the following features, which must be considered in combination with the features of the main claim:
- said filtration medium or mechanism for loss of charge is made of titanium;
- said filtration medium or mechanism for loss of charge is a metal sieve made of sintered stainless steel fibres;
- the generator comprises a means for regulating the metal vapour pressure in the ejector without causing inertia during pressure transients;
- said regulation means comprises a proportional valve with an optional device for loss of charge positioned in said pipe;
- the proportional valve is a throttle type valve;
- the generator comprises a means for adjusting the length of the longitudinal slit to the width of the substrate;
- said means comprises a means for rotating the ejector around its feeder pipe;
- the crucible comprises a mixture of metals in a molten state;
- the crucible is fed by pumping or gravity of molten metal from a melting furnace;
- the crucible comprises an inductor fitted to the outside so as to ensure magnetic stirring of the molten metal;
- the crucible comprises a bleeder towards the melting furnace operated by pumping or gravitic flow;
- the crucible comprises an external means for measuring weight so as to be able to regulate the level of molten metal;
- the ejector, the pipe and the crucible are thermally insulated from the external environment and heated by one of the radiant heating elements, simply called "radiating furnace" herein below;
- the generator comprises an optional means for heating the vacuum housing;
- the generator comprises two crucibles with different metals in a molten state;
- each crucible is connected by its own pipe to a mixer, which is itself connected to the ejector;
- each pipe comprises a valve with an optional device for loss of charge, allowing to adjust the concentrations of each metal during the mixing of the vapours to be deposited on the substrate and to regulate the pressure of the metal vapours in the mixer without causing inertia during pressure transients;
- the mixer is the ejector itself and comprises a filtration medium made of sintered material, allowing to even out the flow speed of the vapour of each metal coming out of the ejector;
- said filtration medium made of sintered material is made of titanium or is in the form of a metal sieve made of sintered stainless steel fibres.

BRIEF DESCRIPTION OF THE FIGURES

FIGS. 2A and 2B show details of embodiments of the molten metal crucible and of the vapour ejector respectively according to one preferred embodiment of the present invention. FIG. 2B shows in particular the simple system for adjusting the vapour jet to the width of the strip by simple rotation of the ejector around its axis.

DETAILED DESCRIPTION OF THE INVENTION

Figure 1A:
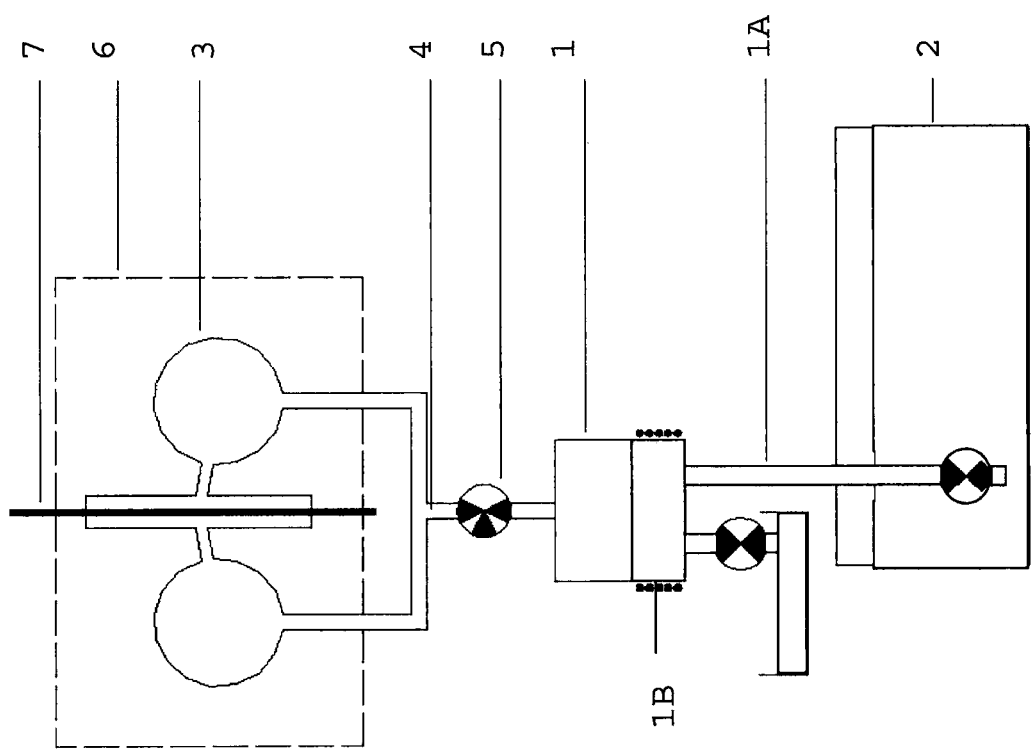
FIGS. 1A to 1C show a schematic view of several embodiments of the industrial vapour generator as in the present invention.

The solution recommended by the present invention consists in using an evaporation crucible that is separated from a JVD ejection head with a longitudinal vapour outlet slit, herein after called an ejector. The general principle of such a device is shown in FIG. 1A. Another schematic view is given in FIG. 1B. An overview description of a pilot installation is provided in FIG. 1C. The crucible 1 is fed by a pipe 1A from a magnesium melting furnace 2, with the impurities being decanted. The type of melting furnace and the pipes used are equipment normally used in the foundry industry and are well know to the man skilled in the art. In particular, the melting and charging in the device as in the invention are carried out by tried and tested techniques.

With the crucible 1 being displaced and of a cylindrical shape, a high level of uniformity of temperature may be achieved thanks to vigorous magnetic stirring. The magnetic stirring performed by an inductor 1B attached to this crucible allows to maintain homogeneity throughout the crucible, the segregation of unevaporated impurities (decantation and flotation) occurring in the melting furnace 2. This ensures consistency over time of the conditions of evaporation and therefore of deposition. The magnetic stirring is adjusted by the induction frequency depending on the nature of the crucible and its size.

The displaced crucible is connected to the ejector 3 (duplicated in FIG. 1A), which is located in the vacuum housing 6 through which the metal strip 7 passes, by a cylindrical pipe 4, whose cross-section is calibrated so as to obtain a slow speed (the speed at the outlet from the crucible ideally being of the order of one metre per second to several tens of metres per second).

The use of a cylindrical pipe allows to obtain a good seal at high temperature and in a vacuum by using, for example, a proportional valve such as a throttle valve 5, as is available on the market. The vapour flow rate, which determines the thickness of the metal deposited, is directly proportional to the effective power provided (power in the inductor less thermal losses), whatever the position of the proportional valve. Without the use of such a valve or by using an On/Off valve as in EP-A-1 174 526, if the temperature of the vapour is raised, the pressure adjusts itself, whilst remaining on the equilibrium curve (P, T), but with a certain inertia, i.e. it is not instantaneous or it causes major transients given the sudden application of energy. The use of a proportional valve allows to obtain different pressures before the valve (at the level of the crucible) and after it for the same temperature. If the power provided is increased, the deposition pressure is initially kept constant. Opening the valve then allows expansion of the vapour and an increase in the deposition pressure corresponding to the equilibrium point on the curve (P, T), i.e. the saturating vapour pressure.

Figure 7:
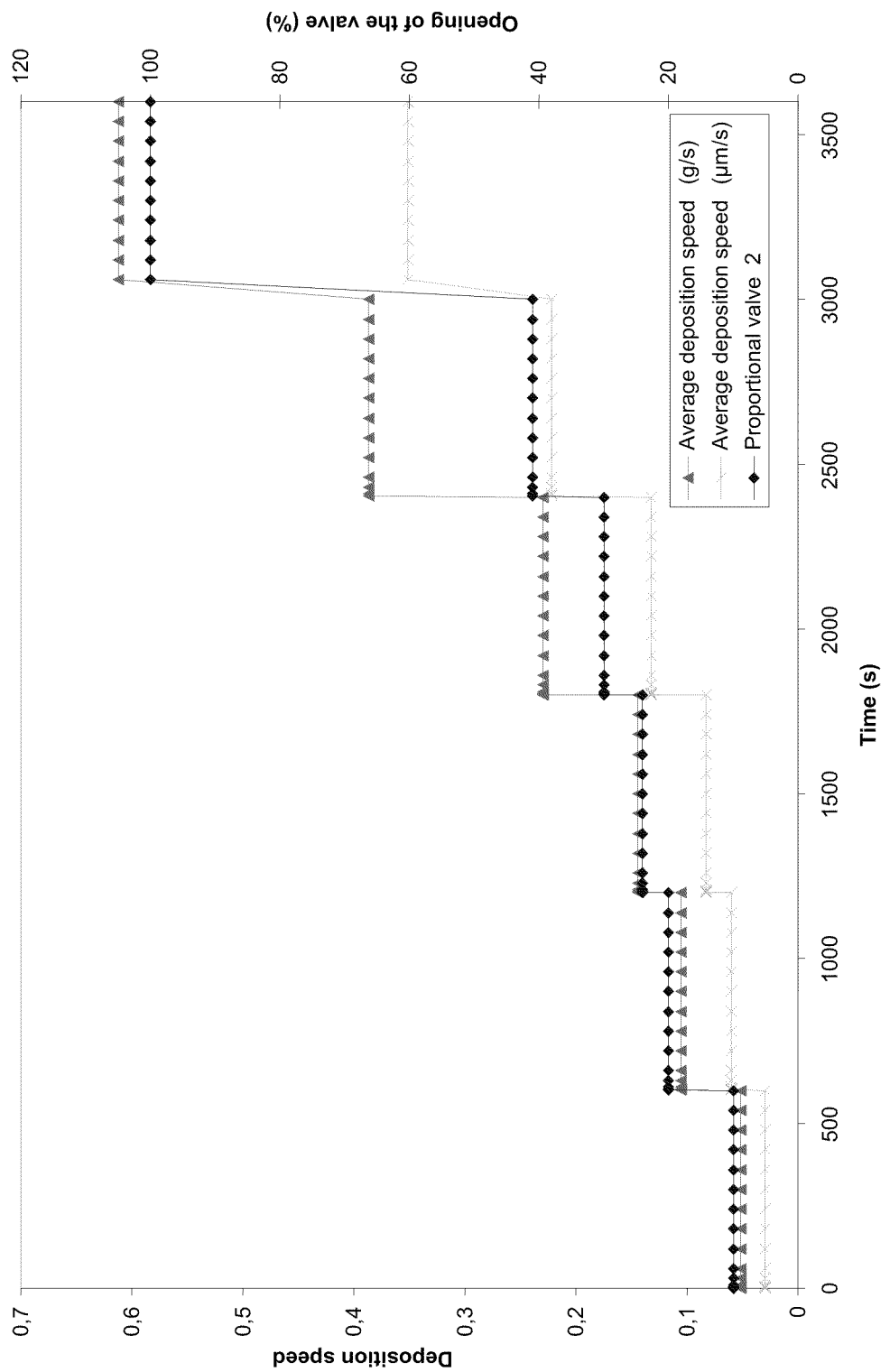
FIG. 7 shows an example of regulation of the opening of the valves in the installation as in the invention as well as the corresponding average deposition speed over time for a molten magnesium temperature that is equal to 690° C.

FIG. 7 shows the use of such a throttle valve 5, possibly with a device for loss of charge 5A, for regulating the vapour flow rate. The flow rates by weight are constant for a given position of the valve and the transients are virtually eliminated.

Another major advantage is that all the part external to the vacuum housing 6 is accessible, the drawback being however that the seal must be achieved in a vacuum and at high temperature at the level of the joints in the displaced part (not shown).

To heat the crucible, the pipe and the ejector, heating of an external radiant furnace type (a cylindrical furnace type with wires or radiating resistors) is used. Such furnaces are used in laboratories up to a temperature of 1,400-1,500° C. This furnace is therefore very robust given that the usual working temperature for this application is of the order of 700° C.

Thanks to this radiant furnace, the vapour is overheated, which allows to move away from the saturating vapour pressure temperature, and therefore from the condensation point. The risk of recondensation is therefore reduced. Moreover, digital simulations have been performed to determine the range of speeds that would prevent the adiabatic expansion and therefore condensation as a result of the temperature reduction that this causes.

The fact of using heating from outside the vacuum chamber, with appropriate insulation, has a certain number of advantages:

- easy maintenance of the heating system;
- isolation and thermal insulation positioned outside the vacuum chamber, restricting the phenomena of outgassing in a vacuum;
- reduction of the problems associated with the use of heating elements in a vacuum and associated with the cooling of their electrical connections;
- limitation of the number of cartridge heaters in a vacuum on the ejector, with a higher use limit (better behaviour over time). For example, two cartridge heaters at 1,100° C. are sufficient in the case of radiation heating;
- use of robust and reliable heating techniques and heating elements.

DESCRIPTION OF PREFERRED EMBODIMENTS OF THE INVENTION

General Installation

Figure 1B:
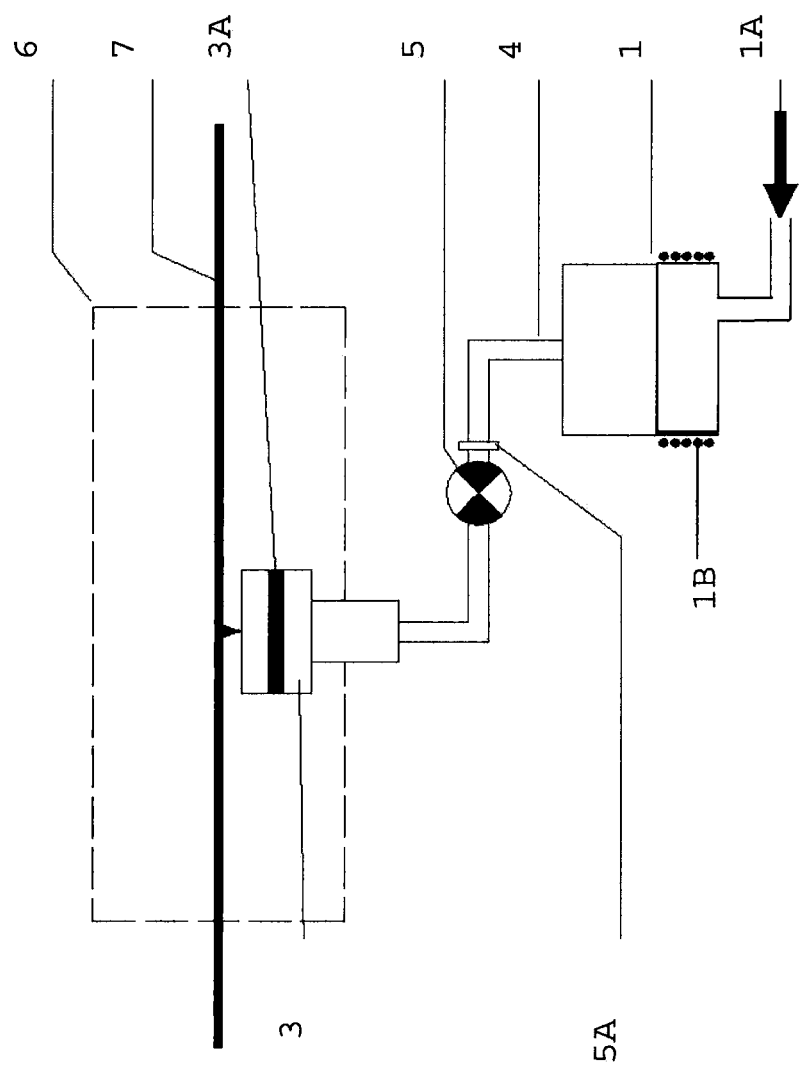
Figure 1C:
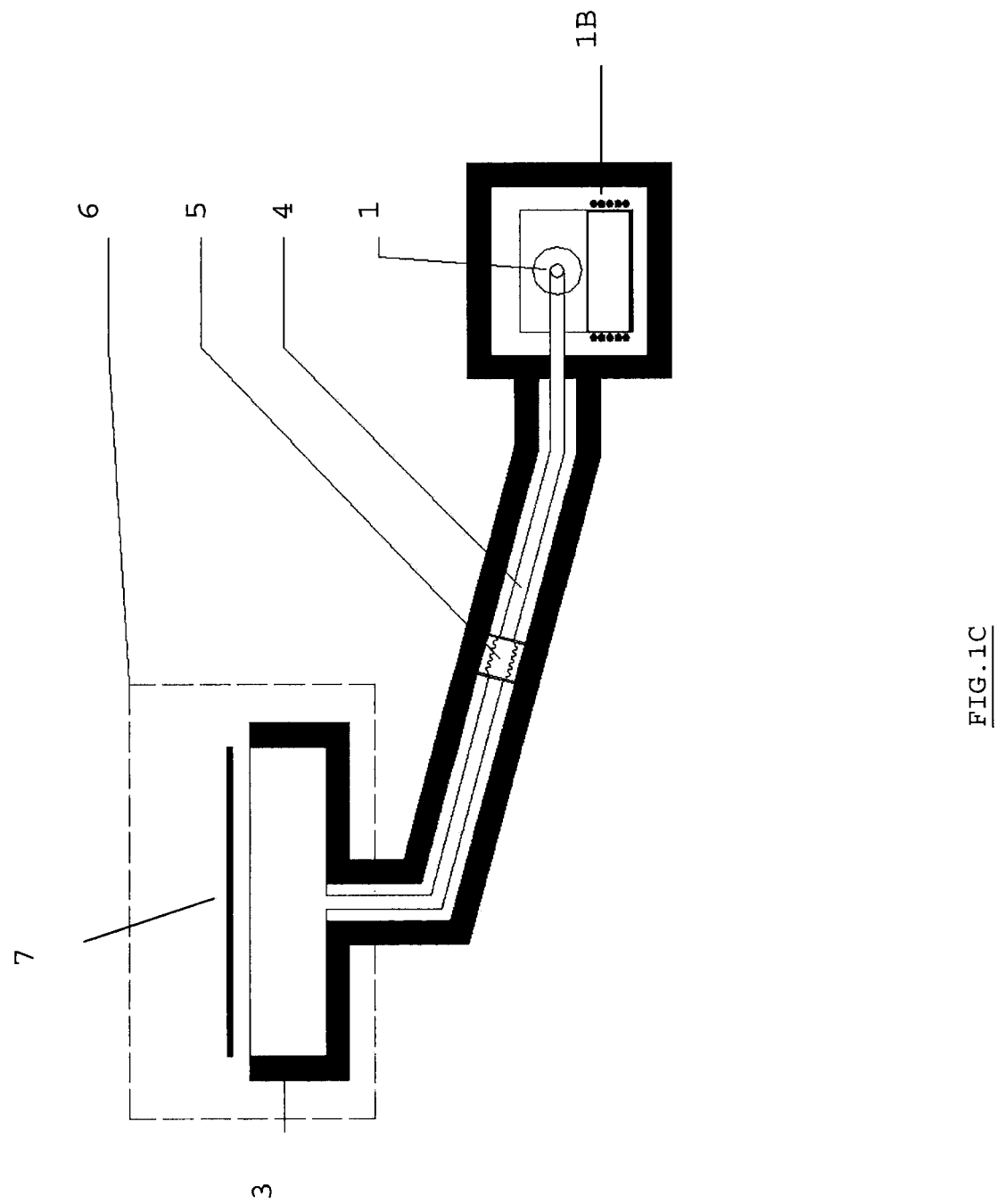

According to one preferred embodiment of the invention shown in FIG. 1B, a cylindrical crucible 1, comprising molten magnesium, is displaced from the tank 6 and connected to a JVD head in the form of a magnesium vapour ejector with an outlet slit positioned transversally across the entire width of the strip. According to the invention, it does not matter whether the latter is positioned in a vertical or horizontal line. The magnesium is pumped from the melting furnace to the crucible by means of a pump but this could also be done more simply by low pressure, the pressure in the crucible thus being lower than that in the melting furnace. The regulation means and the instrumentation are positioned outside the vacuum.

The advantage of this device is that there is no molten magnesium stored in the deposition tank, which reduces the inertia, nor is there any segregation of particles of impurities in a vacuum. The vapour transfer pipe 4 is equipped with heating. The distribution of the magnesium vapour over the width of the strip (before the ejection slit) is ensured by a filtration medium 3A positioned inside the ejector. This device also ensures the filtration and possible heating of the vapour that passes through it. As an advantage, this filtration medium may be a filter made of sintered titanium with a thickness of a few mm or more, for example 3 mm. Titanium is used because it is not corroded by the molten magnesium and because it is resistant to high temperature (unlike bronze and other sintered materials commonly used). As an advantage, a "metal sieve" in the form of sintered stainless steel fibres may also be used as the filtration medium if it can be guaranteed that it will not be in contact with the molten magnesium. For example, a filter of thickness 1 mm from SIKA-FIL (GKN Sinter Metals Filters GmbH, Radevormwald, Germany) may be used. These fibres form mats with a porosity of up to 85% (DIN ISO 30911-3) and an efficient pore size of between about 6 and 60 microns (ASTM E 1294).

The Crucible Itself

Figure 2A:
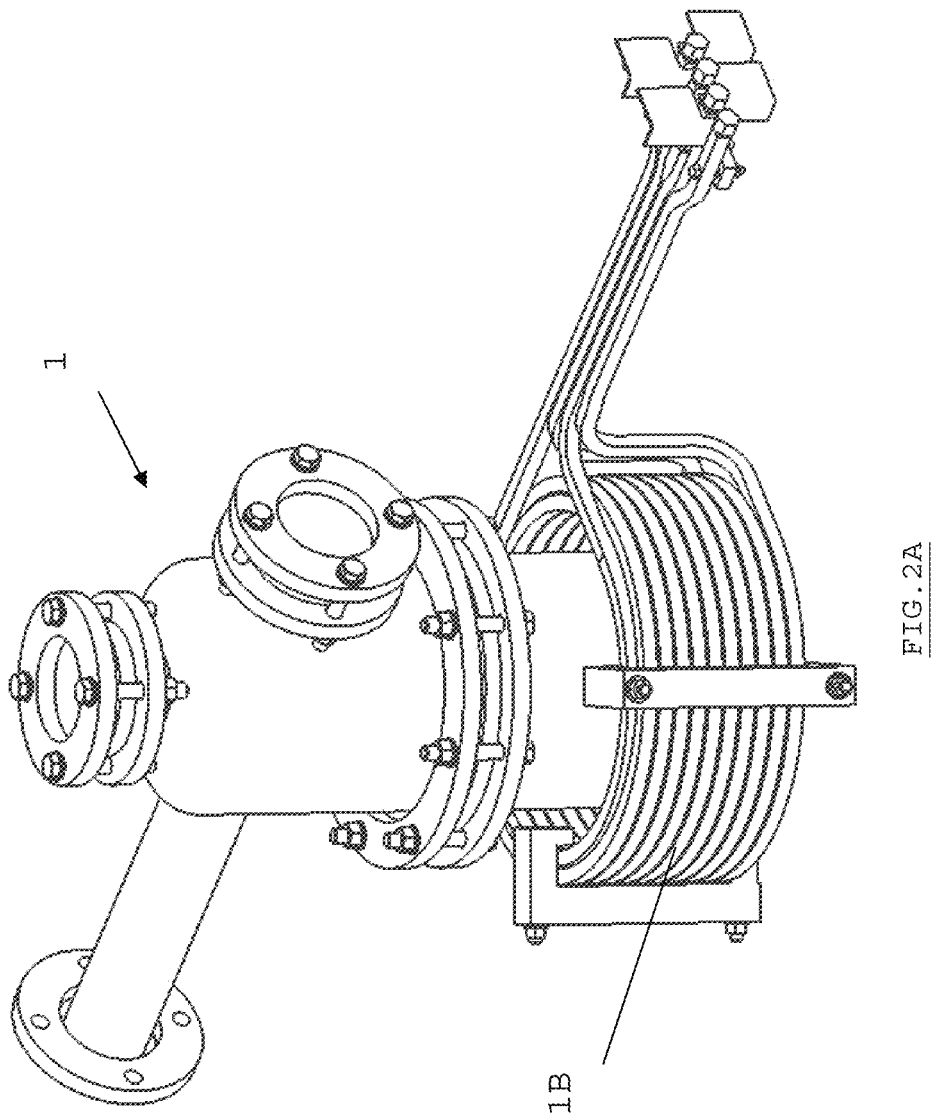

The crucible 1 as in one preferred embodiment of the invention, shown in detail in FIG. 2A, is unique and can easily be accessed for any maintenance work. It is inert to high temperature contact with the molten metal on its inner surface and resistant to oxidation in the air on its outer surface.

It will preferably be made of coated stainless steel or of any material compatible with the metal to be evaporated and with contact with air at high temperature on its outer part. So, in the case of magnesium, a soft iron—stainless steel co-laminate may be chosen.

The heating of the crucible 1 is conventional and is achieved by induction 1B. As an advantage, the frequency is between 400 and 1,000 Hz. Other characteristics of the device implemented are a temperature increase in 20 mins., a direct heating rate of the magnesium of >60%, a stirring speed of >1 m/s, etc.

Thermal inertia is reduced. The device is equipped with a bleeder from the crucible towards the melting furnace operated by gravitic flow or pumping, if there is a problem (not shown).

As an advantage, the level of magnesium in the crucible is regulated by means of weight measurement (scales).

Ejector

The ejector 3 is shown in detail in FIGS. 2B and 3A to 3C. This is a box with a length greater than the width of the strip to be coated. This device comprises a filtration medium or a medium that causes a loss of charge 3A and thereby ensures the evenness of the vapour flow rate across the entire width of the box. The ejector 3 is heated to a temperature higher than that of the metal vapour and is externally insulated. The heating may be internal by means of cartridges (the choice adopted in the present embodiment) but it may also be external by means of radiant resistors. A calibrated slit ensures spraying of the metal vapour over the strip 7 at the speed of sound. The sonic throat across the entire width of the slit complements the filtration medium 3A very effectively in order to ensure the evenness of the deposition on the strip. The adjustment to the width of the strip 7 is achieved by rotating the ejector around its feeder pipe 3C. FIG. 2B shows the internal mechanism of the deposition tank which is now greatly simplified and very reliable. Regulation of the vapour flow rate is ensured by the valve 5 positioned in the circular pipe 4 (see FIG. 1B). As already mentioned, FIG. 7 shows one example of regulation that may be implemented.

Results of Simulations and Trials Obtained with a Pilot Installation

Table 1 gives the parameters of a pilot installation produced to implement the invention compared with the parameters of a typical industrial application in the context of a magnesium deposition application.

TABLE 1

|  | Industrial solution | Pilot solution |
| --- | --- | --- |
| Crucible diameter | 650 mm | 265 mm |
| Generator height | 1,000 mm | 500 mm |
| Pipe diameters | 250 mm | 100 mm |
| Working temperature | 690-750° C. | 690-750° C. |
| Wall temperatures | 750° C. | 750° C. |
| Working pressure | 30 to 70 mbar | 30 to 70 mbar |
| Induction power | 160 kW | 50 kW |
| Working range | 2.5 | 2.5 |
| Molten metal volume | 82 L | 18 L |
| Ejector | 1,600 mm | 450 mm |
| Slit | 10 mm | 5 mm |
| Ejector pressure | A few mmbar | A few mmbar |

Figure 3A:
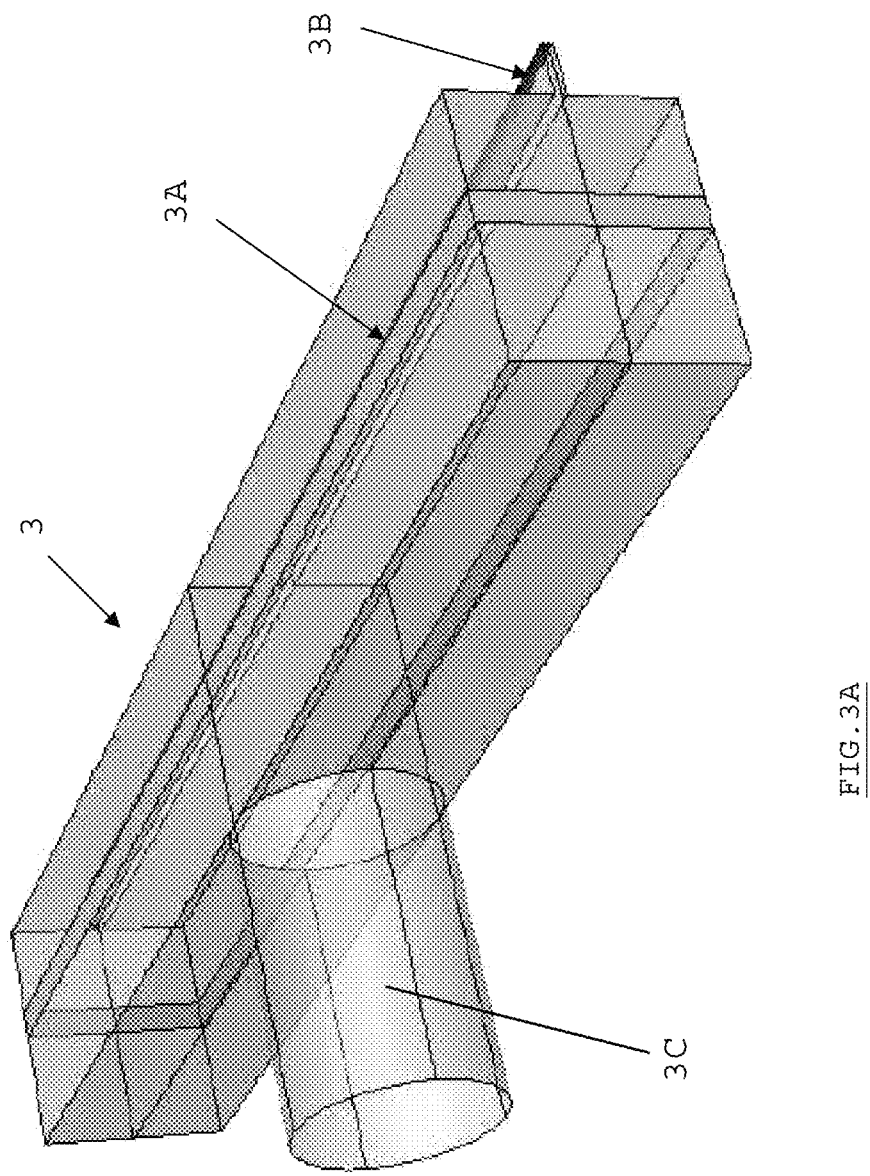
FIGS. 3A to 3C show several views of the vapour ejector as in the present invention, illustrating the even distribution of the vaporised metal.
Figure 3B:
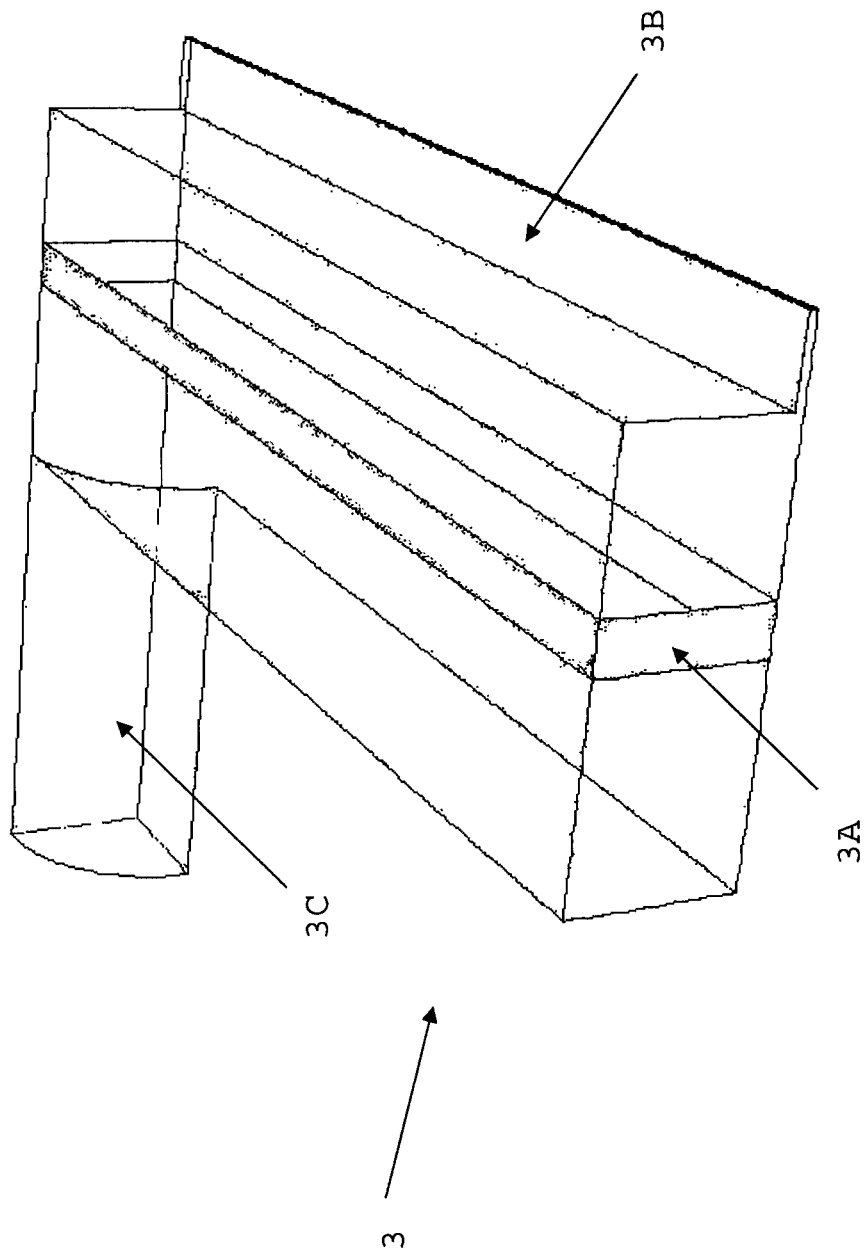
Figure 3C:
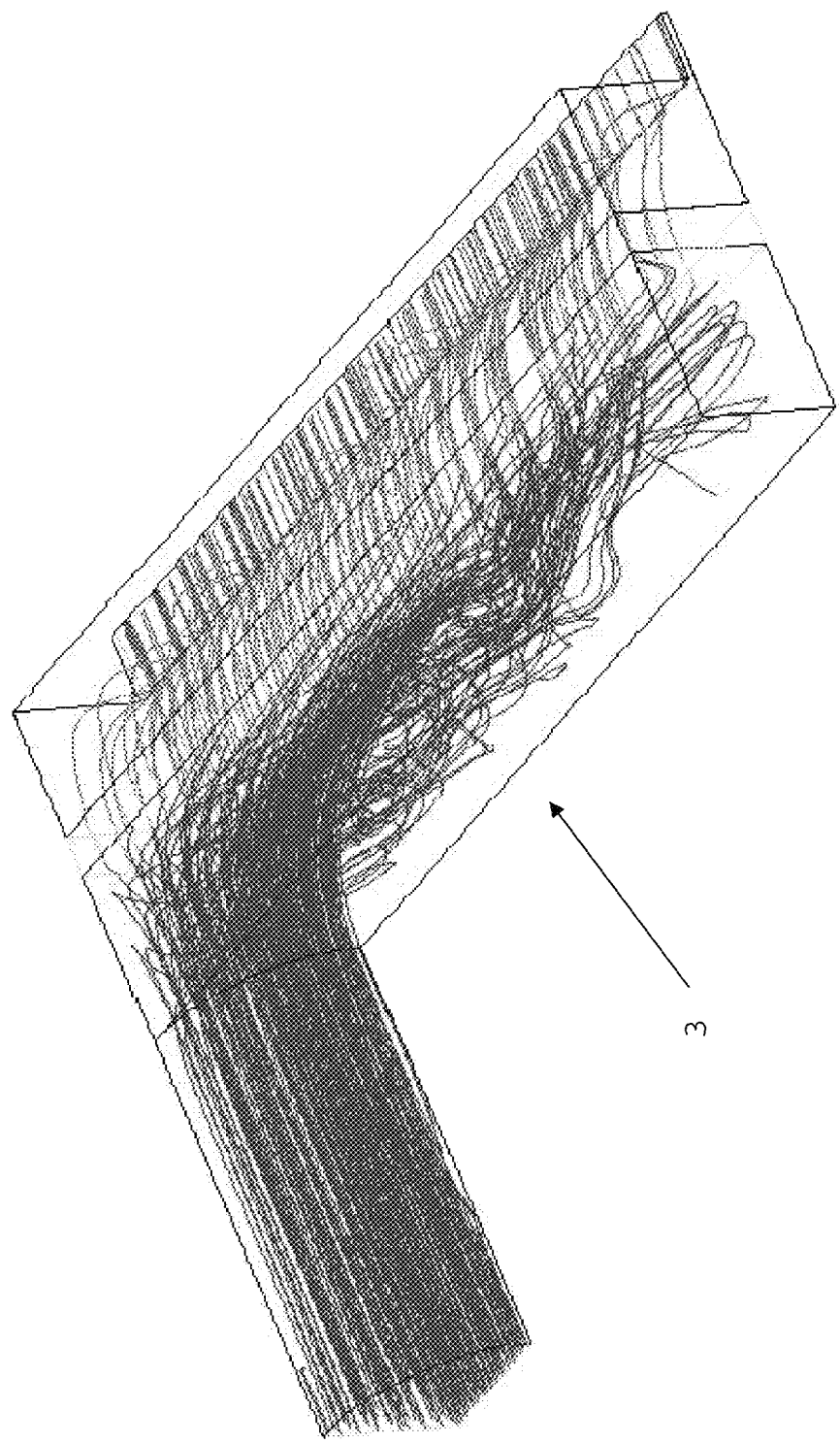

FIGS. 3A to 3C show various perspective views of the ejector 3 equipped with its sintered titanium filter 3A and the ejection slit 3B. FIG. 3C shows a simulation of the vapour trajectories in the ejection head.

Figure 4:
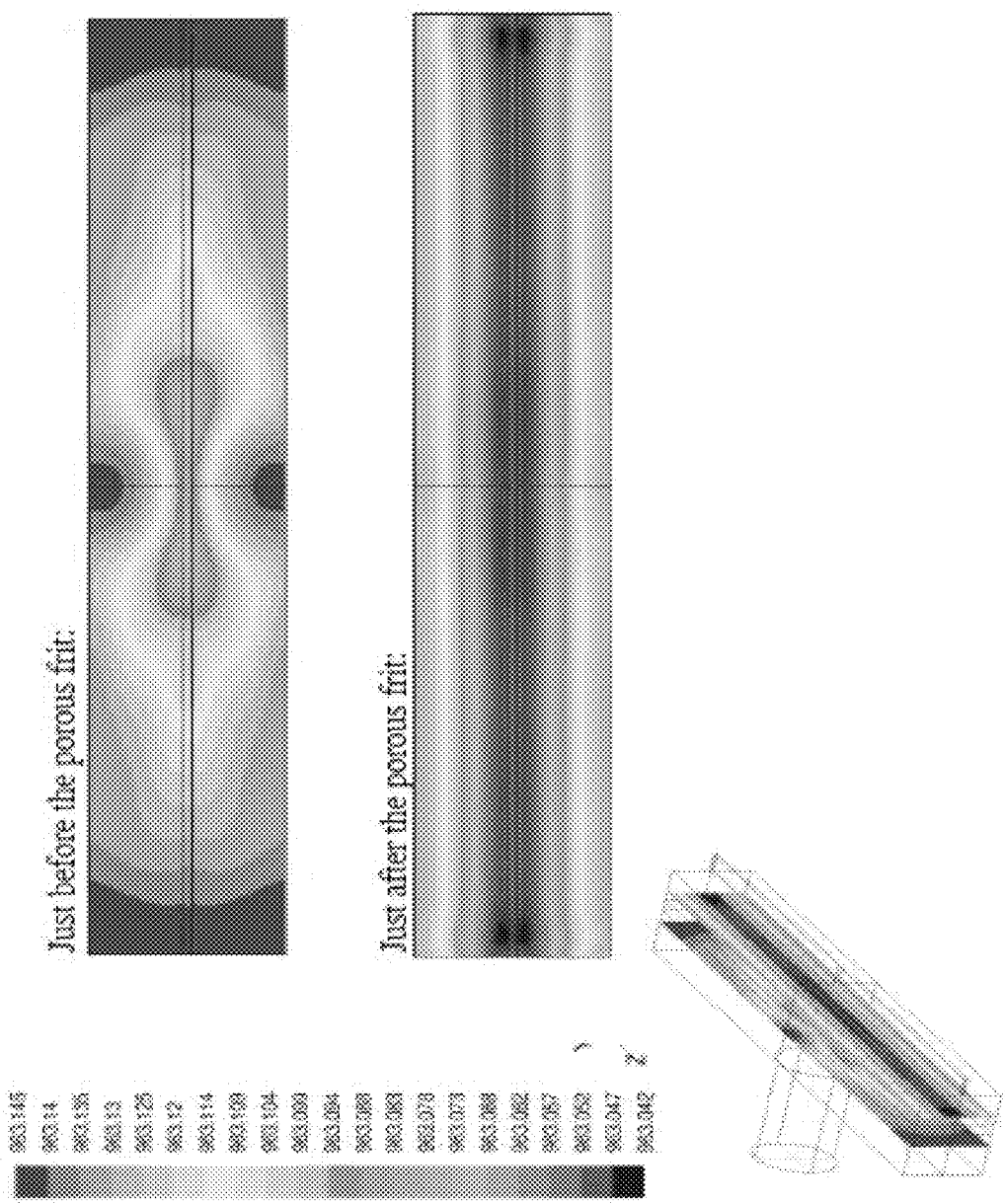
FIGS. 4 and 5 show results of fluid mechanics simulations for the above-mentioned evaporation chamber (temperature and outlet speed, respectively).
Figure 5:
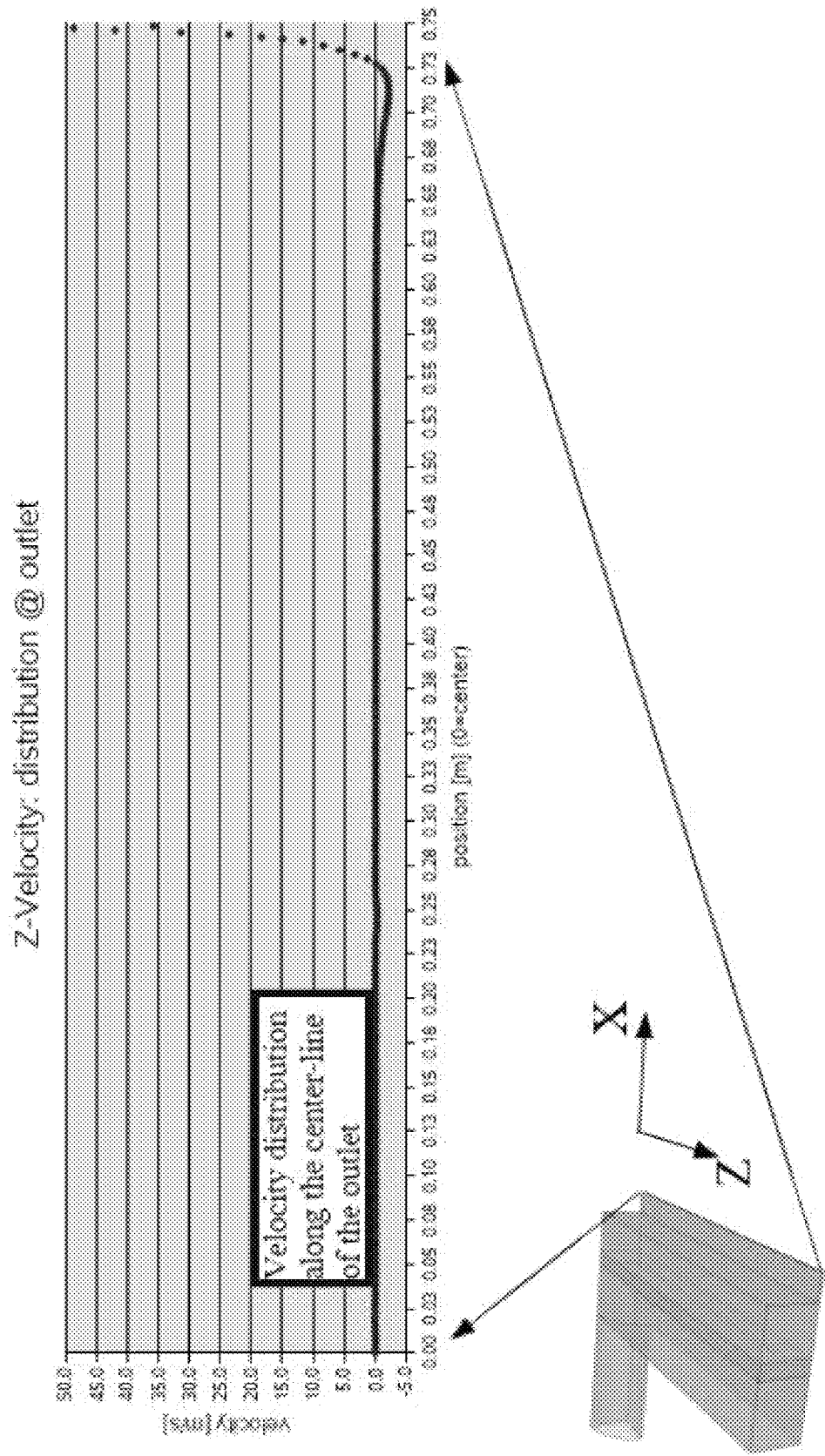

Some results of a digital fluid mechanics simulation applied to the ejector are shown in FIGS. 4 and 5. The vapour temperature differences before and after the sintered filter are very low (0.103K, see FIG. 4). The expansion in the porous material is therefore almost isothermal. Moreover, the distribution of the speeds along the central outlet line is practically constant, the direction of the speed only varying significantly very close to the end of the head (FIG. 5). So, the vapour jet is almost perfectly even and isothermal. The metal vapour deposition on the strip will be even in thickness and in crystalline structure.

Figure 6:
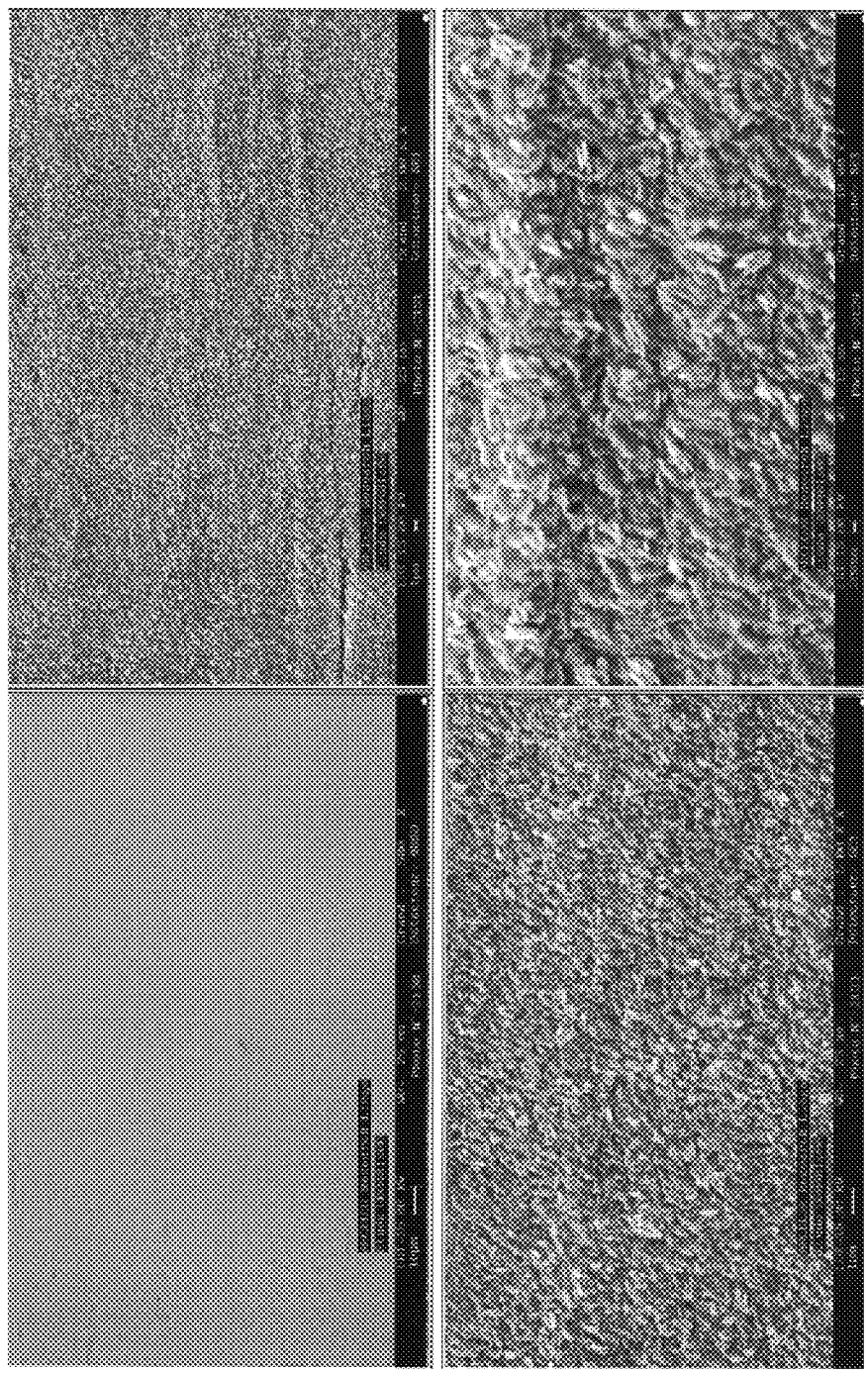
FIG. 6 shows the micrograph taken for a magnesium deposition on blackplate obtained with a pilot installation as in the present invention.

FIG. 6 shows, at different magnifications, the coating of a blackplate sample with magnesium, obtained with the above-mentioned pilot installation. Here, the high level of homogeneity of the deposition can be confirmed.

The device displaced as in the invention is also particularly well suited to alloy deposition by vapour mixing since it allows to adjust the chemical composition deposited without requiring to modify the composition of a molten alloy. The mixing therefore occurs in a pipe at a very low flow speed unlike in the state of the art.

Mixing the Vapours of Two Different Coating Metals

Figure 8:
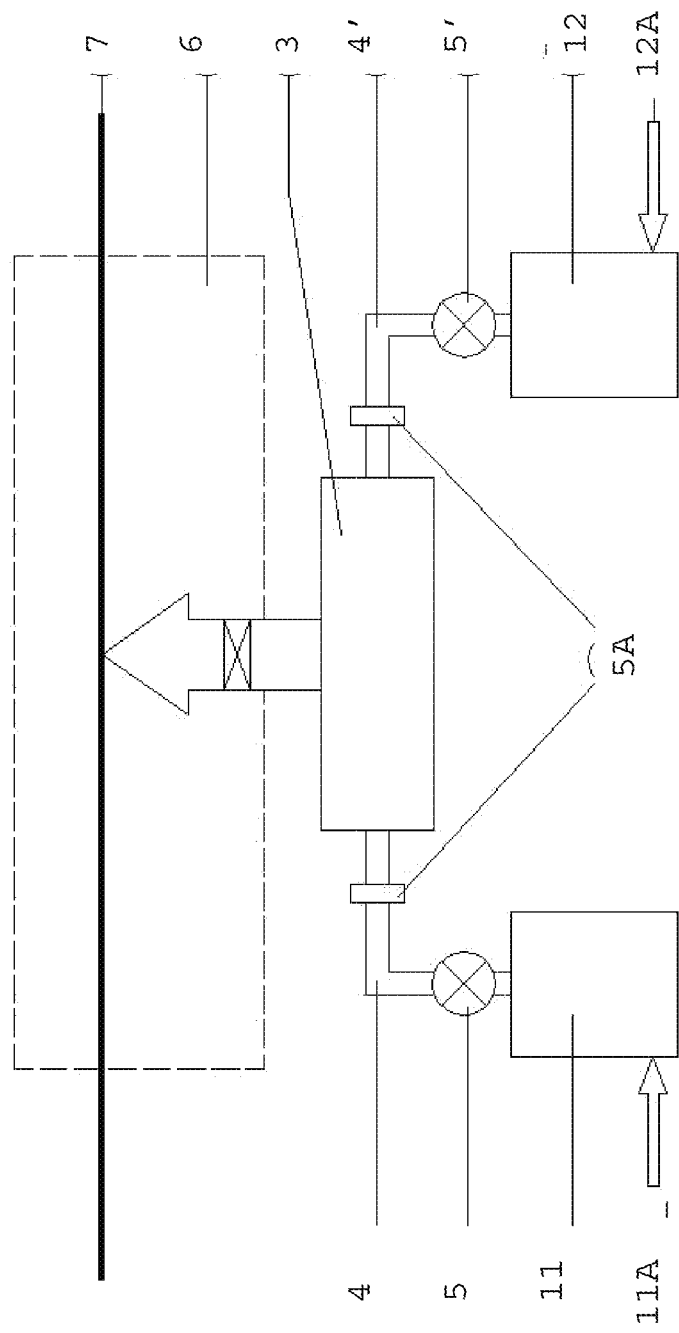
FIG. 8 shows a schematic view of a vapour generator as in the invention in an embodiment allowing to deposit an alloy of two pure metals onto the substrate.

As shown in FIG. 8, two melting chambers 11, 12 each comprising one of two different pure metals (for example zinc and magnesium, respectively) are each connected by pipes 4,4' equipped with valves 5,5' to a mixing chamber linked to the ejector 3. The concentration of the two metals in the mixture is adjusted by means of the energy injected into the crucibles and by means of the respective proportional valves 5,5', which simplifies the control problem. As an advantage, this reduces the bulk of this system.

A system of loss of charge 5A is used on each pipe, co-operating with the respective valves, which allows to obtain vapour at a pressure higher than in the absence of this system (e.g. 20 mbar at 700° C.).

This device also allows to finely and rapidly regulate the vapour flow rate.

Advantages of the Invention

The system as in the invention allows to obtain great evenness of the temperature and speed of the vapour deposited, whilst being reliable and accessible and having very quick response times. The invention therefore meets the requirements of industrialisation of the method very well. Low frequency regulation of the heating by induction ensures great evenness of composition and temperature in the crucible and the vapour flow rate is very easily regulated by means of a valve positioned at the level of the pipe connecting the evaporation crucible and the deposition ejector and by adjusting the energy transmitted to the metal. In WO-A-2005/116290, the level of molten metal in a vacuum, including inside the evaporation chamber, is regulated by means of a magneto-hydrodynamic pump. Unlike in this method as in the state of the art, the regulation of the level as in the invention is achieved by weighing the crucible and the distribution chamber as in the invention is a JVD system equipped with a slit which only comprises the vapour of the metal to be deposited.

The invention claimed is:

1. A vapour generator for depositing a metal coating on a metal strip (7), comprising a vacuum chamber (6) in a form of a housing, the vacuum chamber (6) equipped with a means for ensuring a low pressure state inside it relative to the external environment, by being sealed relative to the external environment, said housing surrounding a vapour deposition head in a form of an ejector (3) fed by an ejector pipe (3C), which is shaped so as to create a jet of metal vapour at the speed of sound in the direction of and perpendicular to the surface of the metal strip (7), the ejector (3) being sealingly connected by means of a feeder pipe (4) and the ejector pipe (3C) to at least one crucible (1,11,12) comprising a coating metal in a molten state and positioned outside the vacuum chamber (6), wherein the ejector (3) is rotatable around an ejector pipe (3C) axis perpendicular to the surface of the metal strip, and wherein the ejector (3) is a box having a longitudinal dimension comprising an outlet slit (3B) for the vapour, wherein said outlet slit is located at an end of a protrusion, said protrusion in direct contact with a metal strip facing side of said box and extending perpendicularly from the metal strip facing side of said box, and wherein said protrusion extends along the entire longitudinal dimension of the box, said outlet slit acting as a sonic throat, said slit (3B) being oriented along said longitudinal dimension and extending across the entire width of the metal strip (7), and wherein the ejector (3) comprises a filter medium (3A) being positioned therein immediately before said slit (3B) in the path of the vapour and cooperating with said slit (3B) so as to even out the flow speed of the vapour coming out of the ejector (3) through the sonic throat.

2. The vapour generator as in claim 1, wherein said filter medium (3A) is made of titanium.

3. The vapour generator as in claim 1, wherein said filter medium (3A) is a metal sieve made of sintered stainless steel fibres.

4. The vapour generator as in claim 1, also comprising a means for regulating the metal vapour pressure in the ejector (3) without causing inertia during pressure transients.

5. The vapour generator as in claim 4, wherein said regulation means comprises a proportional valve (5).

6. The vapour generator as in claim 5, wherein the proportional valve (5) is a throttle valve.

7. The vapour generator as in claim 5, wherein said proportional valve (5) comprises a device positioned in said pipe (4), said device providing a second medium or a mechanism for loss of charge (5A).

8. The vapour generator as in claim 1, wherein the crucible (1) is fed by pumping or by gravity of the molten metal from a melting furnace (2).

9. The vapour generator as in claim 1, wherein the crucible (1) comprises an inductor (1B) attached to its outside so as to ensure the magnetic stirring of the molten metal.

10. The vapour generator as in claim 1, wherein the crucible (1) comprises a bleeder towards a melting furnace (2) operated by pumping or gravitic flow.

11. The vapour generator as in claim 1, wherein the crucible (1) comprises an external means for measuring weight so as to regulate the level of molten metal in it.

12. The vapour generator as in claim 1, wherein the ejector (3), the pipe (4) and the crucible (1) are thermally insulated from the external environment and heated by a radiant furnace.

13. The vapour generator as in claim 1, comprising a means for heating the vacuum housing (6).

14. The vapour generator as in claim 1, comprising two crucibles (11,12) with two different metals in a molten state.

15. The vapour generator as in claim 14, wherein each crucible (11,12) is connected by its own pipe (4,4') to a mixer, which is itself connected to the ejector (3).

16. The vapour generator as in claim 15, wherein each pipe (4,4') comprises a valve (5,5') to allow for adjusting of concentrations of each metal during mixing of the vapours to be deposited on the metal strip (7) and to regulate the pressure of the metal vapours in the mixer without causing inertia during pressure transients.

17. The vapour generator as in claim 16, wherein the mixer is the ejector (3) itself and comprises a sintered material allowing to even out the flow speed of the vapour of each metal coming out of the ejector (3).

18. The vapour generator as in claim 17, wherein said filter medium made of sintered material is made of titanium or is in the form of a metal sieve made of sintered stainless steel fibres.

19. The vapour generator as in claim 16, wherein each valve (5,5') of each pipe (4,4') comprises a device which allows for the adjusting of the concentrations of each metal during mixing of the vapours to be deposited on the metal strip (7) and the regulation of the pressure of the metal vapours in the mixer without causing inertia during pressure transients, said each device providing its own medium or a mechanism for loss of charge (5A).

20. The vapour generator as in claim 1, wherein the metal strip (7) is a steel strip.

21. The vapour generator as in claim 1, wherein the filter medium (3A) extends fully across the longitudinal dimension of the box of the ejector.

* * * * *

UNITED STATES PATENT AND TRADEMARK OFFICE
CERTIFICATE OF CORRECTION

| | |
|---|---|
| PATENT NO. | : 11,434,560 B2 |
| APPLICATION NO. | : 12/681969 |
| DATED | : September 6, 2022 |
| INVENTOR(S) | : Pierre Banaszak et al. |

It is certified that error appears in the above-identified patent and that said Letters Patent is hereby corrected as shown below:

On the Title Page

Item (87):
Line 2, The PCT Publication date reads "Apr. 16, 2019"
Should read --Apr. 16, 2009--

Item (30):
Line 1, The Foreign Application Priority Data reads "07447056"
Should read --07447056.8--

Signed and Sealed this
First Day of November, 2022

Katherine Kelly Vidal
*Director of the United States Patent and Trademark Office*